United States Patent [19]

Takahasi et al.

[11] Patent Number: 4,924,224

[45] Date of Patent: May 8, 1990

[54] HIGH-ACCURACY A/D CONVERTER

[75] Inventors: Kenichiro Takahasi, Ibaraki; Yukichi Ueno, Katsuta, both of Japan

[73] Assignee: Hitachi, Ltd., Tokyo, Japan

[21] Appl. No.: 253,608

[22] Filed: Oct. 5, 1988

[30] Foreign Application Priority Data

Oct. 9, 1987 [JP] Japan .................................. 62-253778

[51] Int. Cl.⁵ .............................................. H03M 1/00
[52] U.S. Cl. ...................................... 341/155; 341/163
[58] Field of Search ........................ 341/155, 163, 126

[56] References Cited

U.S. PATENT DOCUMENTS 4,734,678 3/1988 Take et al. ............................ 341/163

FOREIGN PATENT DOCUMENTS 274515 12/1986 Japan .

OTHER PUBLICATIONS

Eugene Hnatek, "A User's Handbook of D/A and A/D Converters", 1976, pp. 369-372, 383-384.

Primary Examiner—William M. Shoop, Jr.
Assistant Examiner—Helen Kim
Attorney, Agent, or Firm—Antonelli, Terry & Wands

[57] ABSTRACT

An A/D converter comprises a D/A conversion circuit, a sample-holding circuit which samples and holds the output signal of the D/A conversion circuit, a substraction circuit which performs subtraction for the output signal of the D/A conversion circuit and the output signal of the sample-holding circuit, a subtracting-amplifying circuit which performs subtraction for the output signal of the substraction circuit and the input analog signal and amplifies the result of subtraction, a switch circuit which blocks the input analog signal to the subtracting-amplifying circuit, and an A/D conversion circuit which performs A/D conversion selectively for the input analog signal or the output signal of the subtracting-amplifying circuit.

10 Claims, 4 Drawing Sheets

HIGH-ACCURACY A/D CONVERTER

BACKGROUND OF THE INVENTION

This invention relates to a high-accuracy A/D converter, and particularly to a high-accuracy A/D converter suitable for converting an analog signal into a digital signal of 16 bits or more.

A conventional high-accuracy A/D converter of this type is described in JP-A-61-274515. In this A/D converter, an input analog signal is A-D converted with an A/D conversion circuit, the high-order 8 bits are stored in a memory, the stored 8-bit data is D-A converted with a D/A conversion circuit, the resulting analog value is subtracted from the input analog signal, the result of the subtraction is multiplied by 128 and then A-D converted with the above A/D conversion circuit, and the converted result is added to the stored digital value to obtain the final result of A/D conversion for the input analog signal. This conventional technique involves two D/A conversion circuits. The D/A conversion circuits receive digital values having a difference of 1, and the difference of the respective output analog values is multiplied by 128 and then A-D converted. The differences of two output analog values is evaluated for input digital values from 0 to 255 sequentially by incrementing the input digital value by 1 at a time. When the A-D converted value for each difference signal is added sequentially, the digital value produced at each step is stored in the memory. Consequently, D/A conversion for the high-order 8-bit A-D converted value for the input analog signal provides an accurate analog value, and it enables high-accuracy 19-bit A/D conversion.

However, in the foregoing conventional technique, when a digital value is D-A converted separately with two D/A conversion circuits, slightly different analog voltages are produced by the circuits, and this causes a conversion error of the high-accuracy A/D converter. Holding the output voltages of the two D/A conversion circuits accurately imposes difficulties on the design and on the D/A conversion efficiency. Another problem is that when the differential analog value resulting from two digital values which differ by 1 from each other is smaller than the analog voltage for the lowest bit, the voltage component short of the lowest-bit voltage becomes an error. When the differential analog value is greater than the lowest-bit analog voltage, the amplifier which multiplies the differential voltage by 128-fold can be saturated at its maximum range.

SUMMARY OF THE INVENTION

An object of this invention is to overcome the foregoing prior art deficiencies, and provide a more accurate and less expensive A/D converter without sacrificing a short conversion time.

The inventive high-accuracy A/D converter comprises a D/A conversion circuit, a sample-holding circuit which samples and holds the output signal of the D/A conversion circuit, a subtraction circuit which performs subtraction for the output signal of the D/A conversion circuit and the output signal of the sample-holding circuit, a subtracting amplifier which amplifies the difference between the output signal of the subtraction circuit and the input analog signal, and an A/D conversion circuit which performs A/D conversion for the input analog signal or the output signal of the subtracting amplifier selectively.

According to the inventive A/D converter, the sample-holding circuit operates to sample the output voltage of the D/A conversion circuit in response to the sampling signal and holds the voltage until the next sampling signal is applied, so that it provides the same voltage as the output voltage of the D/A conversion circuit at the time of sampling. The output voltage of the D/A conversion circuit, with its digital input being set to zero, is held, and the output voltage of the D/A conversion circuit, with its digital input being incremented by 1, is subtracted by the output voltage of the sample-holding circuit, amplified and then A-D converted, whereby the output voltage for input data 1 to the D/A conversion circuit can be evaluated at high accuracy. Subsequently, the then output voltage of the D/A conversion circuit is previous A-D converted value, and the output voltage for input data 2 to the D/A conversion circuit can be evaluated at high accuracy. These operations are repeated, and high-accuracy values for all output voltages of the D/A conversion circuit are evaluated.

As described above, the inventive A/D converter employs only one D/A conversion circuit, providing the easiness of circuit design and also the enhancement of the D/A conversion efficiency. In addition, by measuring the conversion error of the D/A conversion circuit in advance, errors in measuring D-A converted values can be corrected.

DESCRIPTION OF THE PREFERRED EMBODIMENTS

Figure 1:
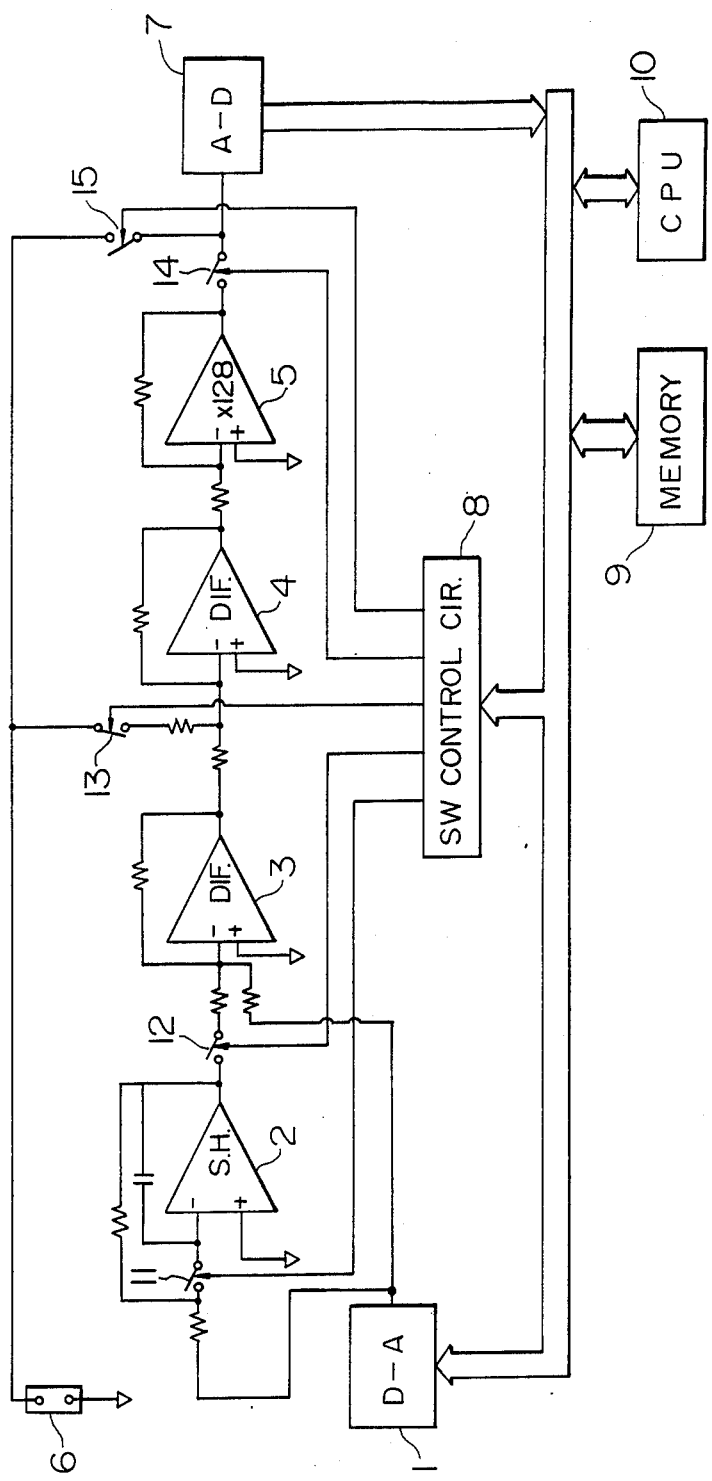
FIG. 1 is a block diagram showing the A/D converter embodying the present invention.

FIG. 1 is a block diagram showing an embodiment of the inventive A/D converter. As shown in the figure, the A/D converter comprises an 8-bit D/A conversion circuit 1, a sample-holding circuit 2 which samples and holds the output signal of the D/A conversion circuit 1, a first subtraction circuit 3 which performs subtraction for the output signals of the D/A conversion circuit 1 and sample-holding circuit 2, a second subtraction circuit 4 which performs subtraction for the output signal of the first subtraction circuit 3 and the input analog signal on the input terminal 6, an amplifier 5 which amplifies by 128-fold the output signal of the second subtraction circuit 4, a 12-bit A/D conversion circuit 7 which receives an output signal of the amplifier 5 through a switch 14 or the input signal on the input terminal 6 through a switch 15 and performs A/D conversion, an analog switch control circuit 8 which controls the operation of the switches 11–15, and a CPU 10 which sets input data in the D/A conversion circuit 1, operates on the A/D conversion circuit 7 to start A/D conversion, reads out converted data, sets control data in the analog switch control circuit 8 for the switches 11–15, writes and reads data in the memory 9, and performs arithmetic operations including addition and subtraction for the data.

Figure 2:
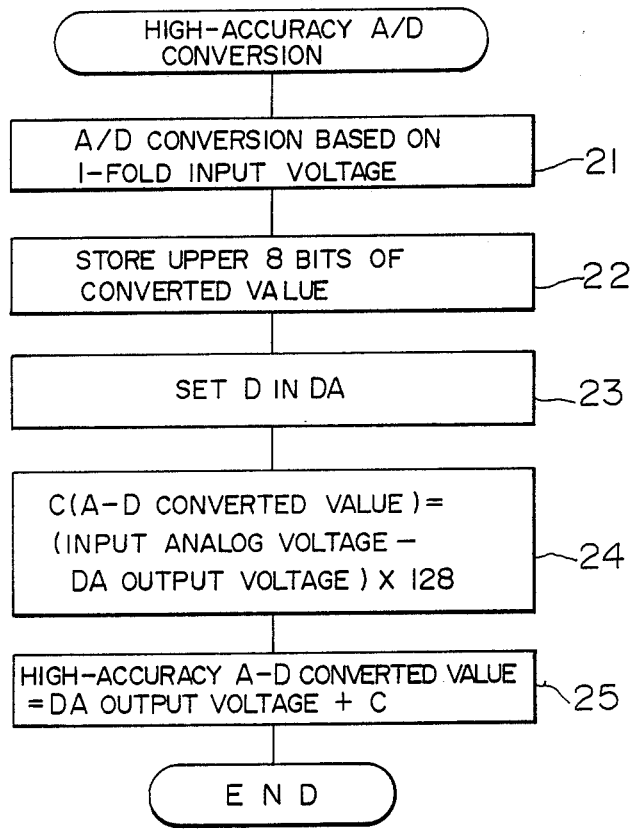
FIG. 2 is a flowchart used to explain the A-D converting operation by the A/D converter shown in FIG. 1.

The A/D converting operation for the input analog signal implemented by the above circuit arrangement will be described with reference to the flowchart of FIG. 2.

Initially, in step 21, the CPU 10 operates on the analog switch control circuit 8 to turn on the switch 15 and turn off the switches 13 and 14, and thereafter the 12 bit A/D conversion circuit 7 implements A/D conversion for the input analog signal, without being amplified, on the input terminal 6. In step 22, the CPU 10 reads output data from the 12-bit A/D conversion circuit 7, stores its high-order 8 bits in the memory 9. In step 23, the CPU 10 fetches the stored data into its register DA as digital input data to the D/A conversion circuit 1, and operates on the circuit 1 to provide a converted output voltage on the output of the first subtraction circuit 3.

In step 24, the CPU 10 turns off the switches 12 and 15 and turns on the switches 13 and 14 so that the input signal voltage is subtracted by the output voltage of the D/A conversion circuit 1, operates on the amplifier 5 to multiply the subtraction result by 128-fold, enters the amplified voltage to the 12-bit A/D conversion circuit 7, and reads out a 12-bit converted data C. In step 25, the CPU 10 adds data, which is stored in advance in the memory 9 in correspondence to the converted high-order 8 bits stored previously in the memory 9, to the 12-bit converted data which is equivalent to the voltage provided currently by the D/A conversion circuit 1. The result of addition is the A-D converted value having a 19-bit accuracy for the input analog signal.

Figure 3:
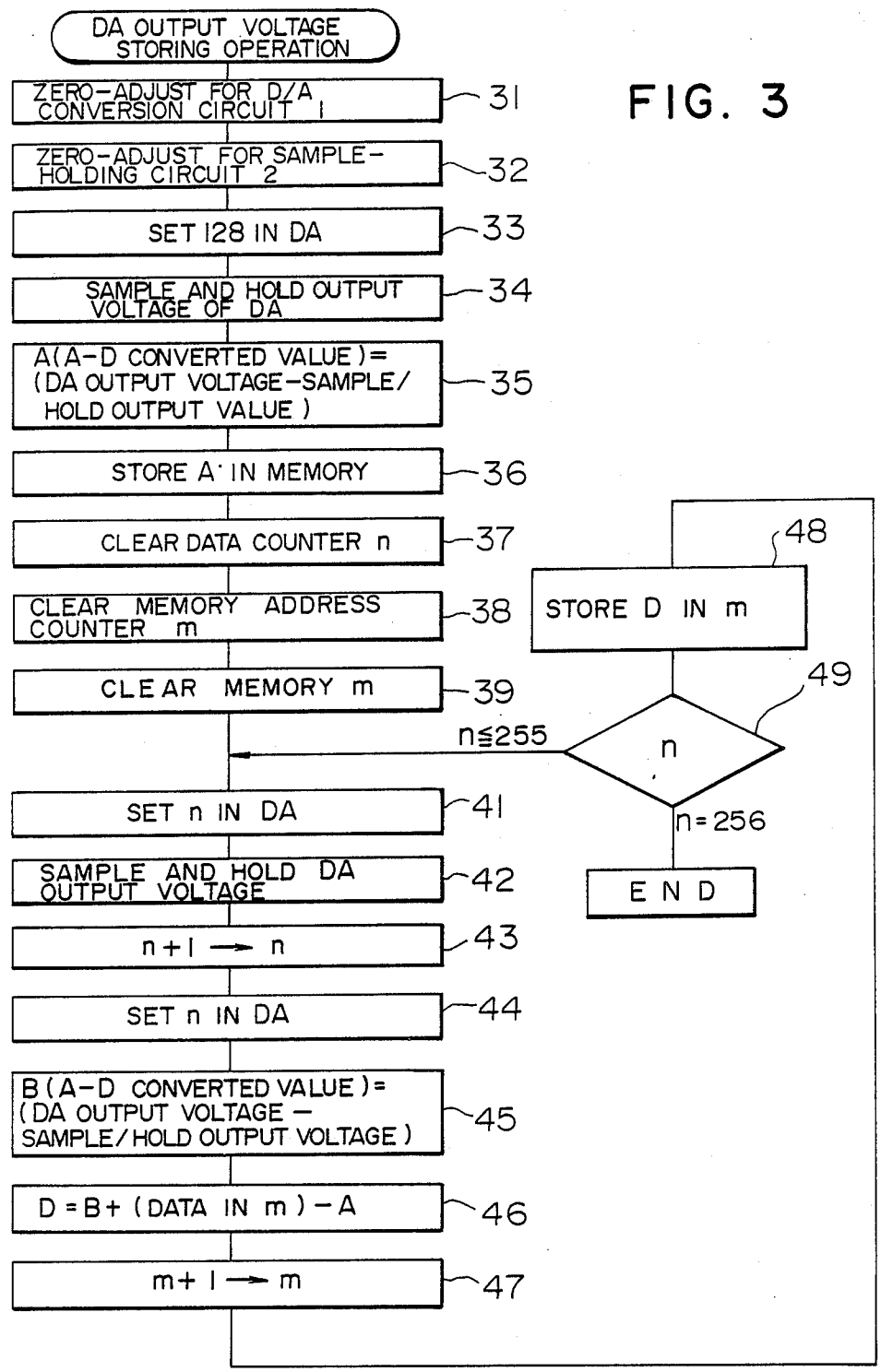
FIG. 3 is a flowchart used to explain the setting operation for the D/A conversion circuit of the D/A converter shown in FIG. 1.

In the above operation, in which the input analog signal is A-D converted by the A/D conversion circuit 7, the high-order 8 bits are stored in the memory 9 and the 8-bit data is converted back to an analog signal by the D/A conversion circuit, it is crucial for the achievement of high-accuracy A/D conversion to produce the analog signal which is consistently accurate with the high-order 8-bit data. The following describes in FIG. 3 the signal processing which enables the input analog signal, converted digitally by the A/D conversion circuit 7, to be reproduced accurately by the D/A conversion circuit 1.

Initially, in step 31, the CPU 10 turns off the switch 12 to enter digital data 0 to the D/A conversion circuit 1. At this time, the D/A conversion circuit 1 has its circuit parameters adjusted such that it produces a zero output voltage.

Next, in step 32, the switch 11 is turned on, and the sample-holding circuit 2 is adjusted for its circuit parameters such that it produces a zero output voltage when data 0 is entered to the D/A conversion circuit 1.

In step 33, the CPU 10 operates on the control circuit 8 to turn off the switches 13 and 15 and turn on the switches 11, 12 and 14, and thereafter loads value 128 into its data register DA. In step 34, the CPU 10 turns off the switch 11 so that the then output of the D/A conversion circuit 1 is held by the sample-holding circuit 2. Next, in step 35, the output $D_{128}$ of the D/A conversion circuit 1 for the existing data 128 is subtracted by the output $D_{128+\alpha}$ of the sample-holding circuit 2 to produce a result $-\alpha$ by the subtraction circuit 3, and it is amplified by 128-fold to obtain $-\alpha \times$ 128. After the multiplied value has been converted digitally by the A/D conversion circuit 7, it is stored as an error value A in step 36.

In step 37, the CPU 10 clears the data counter n, clears the memory address counter m in step 38, and clears the area m in the memory 8 in step 39.

In step 41, the CPU 10 loads the contents of data counter n into the data register DA, and in step 42 turns on the switch 11 so that the D-A converted value for the data in the register DA is held by the sample-holding circuit 2. The data is 0 at this time point, and converted volt is held in the sample-holding circuit 2. Subsequently, in step 43, the CPU 10 turns off the switch 12 and increments the data counter n by one, and in step 44 loads the contents of counter n into the register DA. In step 45, the subtraction circuit 3 subtracts the output of sample-holding circuit 2 from the output of D/A conversion circuit 1, the amplifier 5 multiplies the subtraction result by 128-fold, and the A/D conversion circuit 7 converts the multiplied value into digital value B for one bit.

In step 46, data $D_{n-1}$ obtained previously in the memory m is added to the value B, and the result is subtracted by the D/A conversion error A to produce digital value $D_n$. The digital value D is the data set in the register DA multiplied by 128-fold, i.e., shifted upward by 8 bits, and it is rid of errors attributable to the circuits 1 and 2. The value D is the stored DA output voltage value which is read in step 25 of FIG. 2. The data is 1 at this time point, and the value D is stored in the memory m as a digital value for the input of 1 to the D/A conversion circuit 1.

In step 47, the memory address counter m is decremented by one, and in step 48 the digital value D obtained in step 46 is stored in the memory m. Step 49 tests whether or not the contents of data counter n has reached 255. Since n is 1 at this time point, the sequence returns to step 41.

Figure 4:
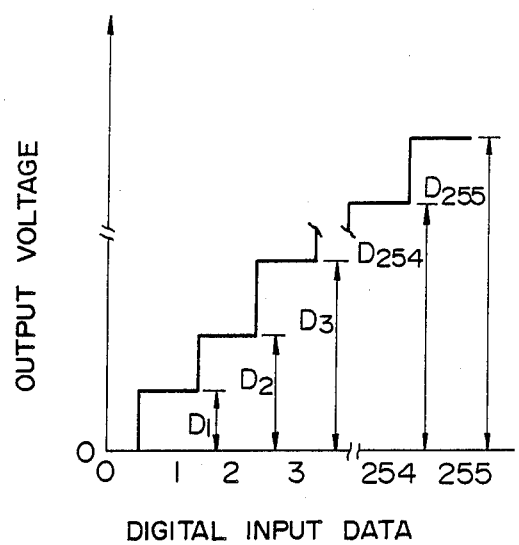
FIG. 4 is a graph showing the input data vs. output voltage relation of the D/A conversion circuit shown in FIG. 1.

The operations of steps 41–49 are repeated, while incrementing each setup data by one at a time, and resulting digital values $D_n$ are stored sequentially in the memory m, resulting in input/output characteristics as shown in FIG. 4. It should be noted that the iterative D/A conversion for data up to 255 in step 49 is for the sake of preparing digital values up to "11111111".

Figure 5:
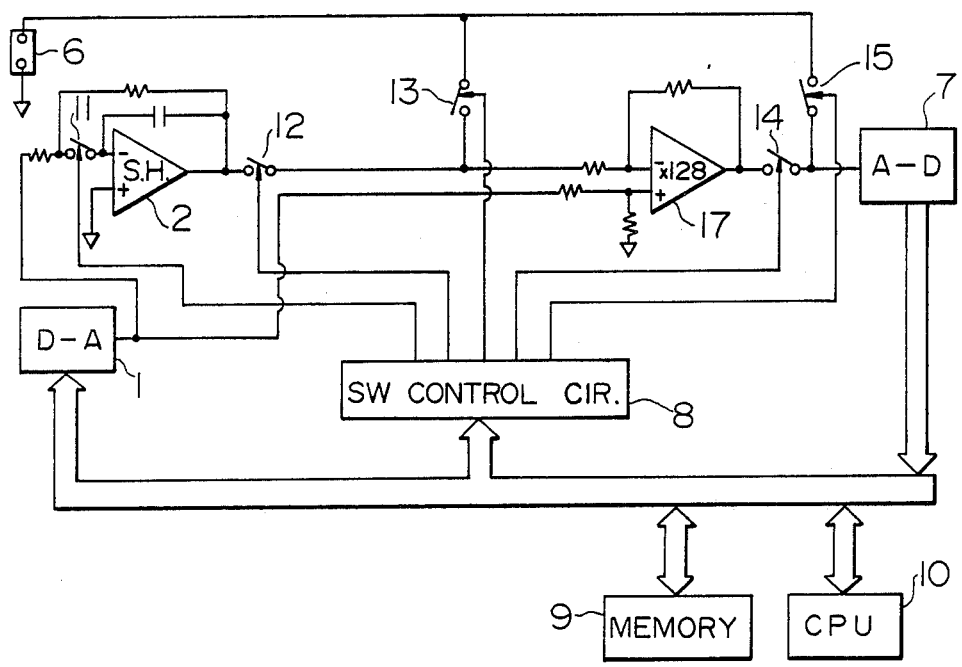
FIG. 5 is a block diagram showing another embodiment of this invention.

FIG. 5 shows another embodiment of this invention. This embodiment is identical to the preceding one except that the first and second subtracters 3 and 4 and amplifier 5 in FIG. 1 are replaced with a subtracting amplifier 17, and it performs the same switching operation as the previous embodiment of FIG. 1.

As described, by adding the A-D converted value for value n to the previous result, it becomes possible to obtain the output voltage for the digital input data n as an A-D converted value with a 128-fold accuracy. For an 8-bit D/A conversion circuit 1 having an output voltage range of 10 volts and a 12-bit A/D conversion circuit 7 having an input voltage range of 10 volts, the highest-bit voltage of D/A conversion circuit 1 multiplied by 128 is about 5 volts, i.e., 10 volts / 255 × 128 = 5 volts, and it provides a value of 12 bits minus 1 bit equal to 11 bits. Since the output voltage of D/A conversion circuit 1 is 255 times the value of 11 bits, the output of D/A conversion circuit 1 is converted digitally at an accuracy of 11 bits plus 8 bits equal 19 bits, and stored in the memory 9:

The A/D converter of this embodiment is capable of executing 19-bit A/D conversion in 100 µs. The available resolution and conversion time is calculated for the A/D conversion circuit 7 having a number of conversion bits of n and conversion time of $t_n$ (about 20 μs), and the D/A conversion circuit 1 having a number of conversion bits of m and conversion time of $t_m$ (about 10 μs), as follows.

Number of conversion bits: $n+m-1$
Conversion time: $tn+tm+t\alpha+t_{CPU}$
where $t_\alpha$ is the response time of switches and amplifiers (about 20 μs) and $t_{CPU}$ is the operating time of the CPU 10 (about 50 μs).

Accordingly, a high-accuracy A/D converter of 16–20 bits is offered.

As described above, this invention accomplishes a high-resolution A/D converter by combining a low-resolution A/D conversion circuit and a low-resolution D/A conversion circuit.

We claim:

1. A high-accuracy A/D converter comprising:
   digital signal generation means which generates a digital signal;
   a D/A conversion circuit which performs D/A conversion for the signal provided by said digital signal generation means;
   a sample-holding circuit which samples and holds the output signal of said D/A conversion circuit;
   an input terminal for an input signal to be rendered A/D conversion;
   a subtracting-amplifying circuit which performs subtraction selectively between the output signal of said D/A conversion circuit and the output signal of said sample-holding circuit or between the output signal of said D/A conversion circuit and the input signal from said input terminal, and amplifies the subtracted signal;
   a switching circuit which selects one of the signal from said subtracting-amplifying circuit and the input signal from said input terminal; and
   an A/D conversion circuit which performs A/D conversion for the signal from said switching circuit.

2. An A/D converter according to claim 1, wherein said subtracting-amplifying circuit comprises:
   a first subtraction circuit which performs subtraction for the signal from said D/A conversion circuit and the signal from said sample-holding circuit;
   first means for interrupting said subtracting-amplifying circuit between said sample-holding circuit and said first subtraction circuit;
   a second subtracting-amplifying circuit which performs subtraction for the signal from said first subtraction circuit and the input signal from said input terminal, and amplifies the result of subtraction; and
   second means for interrupting said subtracting-amplifying circuit between said input terminal and said second subtracting-amplifying circuit.

3. An A/D converter according to claim 2, wherein said second subtracting-amplifying circuit comprises:
   a second subtraction circuit which performs subtraction for the signal from said first subtraction circuit and the input signal from said input terminal; and
   an amplifier which amplifies the signal from said second subtraction circuit.

4. An A/D converter according to claim 3, wherein said amplifier comprises a circuit which performs 128-fold amplification.

5. An A/D converter according to claim 1, wherein said subtracting-amplifying circuit comprises:
   selection means which selects one of the output signal of said sample-holding circuit and the input signal from said input terminal; and
   a subtracting-amplifier which performs subtraction for the output signal from said D/A conversion circuit and the signal from said selection means.

6. An A/D converter according to claim 1, wherein said digital signal generation means comprises means for generating an arbitrary digital value which can be converted by said D/A conversion circuit.

7. An A/D converter according to claim 6 further comprising a memory which stores the output signal of said A/D conversion circuit.

8. An A/D converter according to claim 7, wherein said subtracting-amplifying circuit performs subtraction between the signal from said sample-holding circuit which holds the signal produced by said D/A conversion circuit for an arbitrary digital signal provided by said digital signal generation circuit and the signal from said D/A conversion circuit, and amplifies the result of subtraction to detect an error, and wherein said A/D conversion circuit performs A/D conversion for the signal representing the error, said A/D converter further comprising means for storing the signal from said A/D conversion circuit in said memory.

9. An A/D converter according to claim 8 wherein said digital signal generation means introduces digital values from 0 to a specified value within the conversion range of said D/A conversion circuit by incrementing the value one at a time, and wherein said sample-holding circuit holds each value converted by said D/A conversion circuit for each digital value provided by said digital signal generation means, and wherein said subtracting-amplifying circuit subtracts, from the signal from said D/A conversion circuit, the signal which is smaller by one in digital value than said signal from D/A conversion circuit and is held in said sample-holding circuit, and wherein said A/D conversion circuit performs A/D conversion for the signal from said subtracting-amplifying circuit, said A/D converter further comprising means for correcting the signal from said A/D conversion circuit using the error signal stored in said memory, and means for evaluating a digital value by adding the corrected signal provided by said correction means to a digital value which is previously evaluated for a value smaller in digital value by one than a signal which is introduced into said D/A conversion circuit.

10. An A/D converter according to claim 9 further comprising:
    converting-storage means which operates on said A/D conversion circuit to perform A/D conversion for the input signal from said input terminal and stores the result in said memory;
    reading-conversion means which reads out a plurality of high-order bits of said digital value stored in said memory in accordance with the signal stored by said converting-storage means, and operates on said D/A conversion circuit to convert the readout bits into an analog value;
    subtracting-conversion means which operates on said subtracting-amplifying circuit to subtract the analog value read out by said reading-conversion means from said input signal, amplifies the result of subtraction, and operates on said A/D conversion circuit to perform A/D conversion for the amplified value; and
    adding means which adds the high-order bits stored in said memory to the signal from said subtracting-conversion means.

* * * * *